United States Patent
Barlow et al.

(10) Patent No.: US 11,251,717 B1
(45) Date of Patent: Feb. 15, 2022

(54) INTEGRATED SILICON CARBIDE DIODE RECTIFIER CIRCUITS

(71) Applicants: Matthew Barlow, Springdale, AR (US); James A. Holmes, Fayetteville, AR (US)

(72) Inventors: Matthew Barlow, Springdale, AR (US); James A. Holmes, Fayetteville, AR (US)

(*) Notice: Subject to any disclaimer, the term of this patent is extended or adjusted under 35 U.S.C. 154(b) by 54 days.

(21) Appl. No.: 16/899,941

(22) Filed: Jun. 12, 2020

Related U.S. Application Data

(63) Continuation-in-part of application No. 16/183,115, filed on Nov. 7, 2018, now Pat. No. 10,720,853.

(60) Provisional application No. 62/582,752, filed on Nov. 7, 2017.

(51) Int. Cl.
| | | |
|---|---|---|
| H02M 7/217 | (2006.01) | |
| H01L 29/808 | (2006.01) | |
| H02M 7/219 | (2006.01) | |
| H02M 7/06 | (2006.01) | |

(52) U.S. Cl.
CPC ........ *H02M 7/2176* (2013.01); *H01L 29/808* (2013.01); *H02M 7/219* (2013.01); *H02M 7/06* (2013.01)

(58) Field of Classification Search
CPC ........ H02M 7/06; H02M 7/064; H02M 7/068; H02M 7/217; H02M 7/2176; H02M 7/219; H01L 27/06; H01L 27/0605; H01L 29/80; H01L 29/808
See application file for complete search history.

(56) References Cited

U.S. PATENT DOCUMENTS

| | | | |
|---|---|---|---|
| 3,701,117 A | 10/1972 | Fuller | 340/173 |
| 3,909,700 A * | 9/1975 | Ferro | H02M 7/2173 363/147 |
| 4,933,737 A | 6/1990 | Nakamura et al. | 357/50 |
| 7,688,117 B1 | 3/2010 | Krasowski | 326/112 |
| 7,935,601 B1 | 5/2011 | Neudeck | 438/285 |
| 8,416,007 B1 | 4/2013 | Krasowski | 327/430 |
| 8,841,698 B2 | 9/2014 | Neudeck | 257/134 |
| 9,013,002 B1 | 4/2015 | Spry | 23/485 |
| 10,720,853 B1 | 7/2020 | Barlow et al. | |
| 2014/0027810 A1 | 1/2014 | Yang et al. | 257/133 |
| 2017/0047744 A1 * | 2/2017 | Kim | H02M 1/36 |

FOREIGN PATENT DOCUMENTS

JP    2017041998    * 2/2017    ............ H02M 3/28

* cited by examiner

*Primary Examiner* — Matthew V Nguyen
(74) *Attorney, Agent, or Firm* — Keisling & Pieper PLC; David B. Pieper; Trent C. Keisling

(57) ABSTRACT

An integrated silicon carbide rectifier circuit with an on chip isolation diode. The isolation diode can be a channel-to-substrate isolation diode or a channel to channel isolation diode. the circuit teaches an integrated diode rectification circuit for use with a two phase center tap transformer having a first voltage output, a second voltage output, and a center tap output with a single chip having a first half-wave rectifier connected to the first voltage output, a second half-wave rectifier connected to the second voltage output, and a floating substrate connection connected to the center tap output and an on chip first channel-to-substrate isolation diode electrically connected between the first half-wave rectifier and the floating substrate.

4 Claims, 2 Drawing Sheets

INTEGRATED SILICON CARBIDE DIODE RECTIFIER CIRCUITS

CROSS-REFERENCE TO RELATED APPLICATIONS

This application claims priority to and is a continuation-in-part of U.S. patent application Ser. No. 16/183,115, filed on Nov. 7, 2018 entitled Integrated Silicon Carbide Diode Rectifier Circuits which is a continuation-in-part of U.S. Patent Application Ser. No. 62/582,752, filed on Nov. 7, 2017 entitled Integrated Silicon Carbide Diode Rectifier Circuits both of which are hereby incorporated by reference in its entirety.

STATEMENT REGARDING FEDERALLY SPONSORED RESEARCH OR DEVELOPMENT

This invention was made with government support by the U.S. Department of Energy, advanced data logging electronics for high pressure and temperature subsurface, contact No. DE-SC0017131 (SBIR/STTR-GTC-0024). The government has certain rights in the invention.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in electrical circuits. More particularly, the invention relates to integrated silicon carbide diode rectifier circuits. In particular, the present invention relates specifically to an isolation diode from a JFET style N-channel to a P-Substrate.

2. Description of the Known Art

As will be appreciated by those skilled in the art, electrical circuits are known in various farms. Patents disclosing information relevant to circuit designs include: U.S. Pat. No. 7,688,117, issued to Krasowski on Mar. 30, 2010 entitled N channel JFET based digital logic gate structure; U.S. Pat. No. 7,935,601, issued to Neudeck on May 3, 2011 entitled Method for providing semiconductors having self-aligned ion implant; U.S. Pat. No. 8,416,007, issued to Krasowski on Apr. 9, 2013 entitled N channel JFET based digital logic gate structure; U.S. Pat. No. 8,841,698, issued to Neudeck on Sep. 23, 2014 entitled Method for providing semiconductors having self-aligned ion implant; U.S. Pat. No. 9,013,002, issued to Spry on Apr. 21, 2015 entitled Iridium interfacial stack (IRIS). Each of these patents is hereby expressly incorporated by reference in their entirety.

From these prior references it may be seen that these prior art patents are very limited in their teaching and utilization, and an improved circuit is needed to overcome these limitations.

SUMMARY OF THE INVENTION

The present invention is directed to an improved integrated silicon carbide diode rectifier circuits using an isolation diode. In accordance with one exemplary embodiment of the present invention, a isolation diode is provided from a JFET N-channel to a P-Substrate. These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

Figure 1:
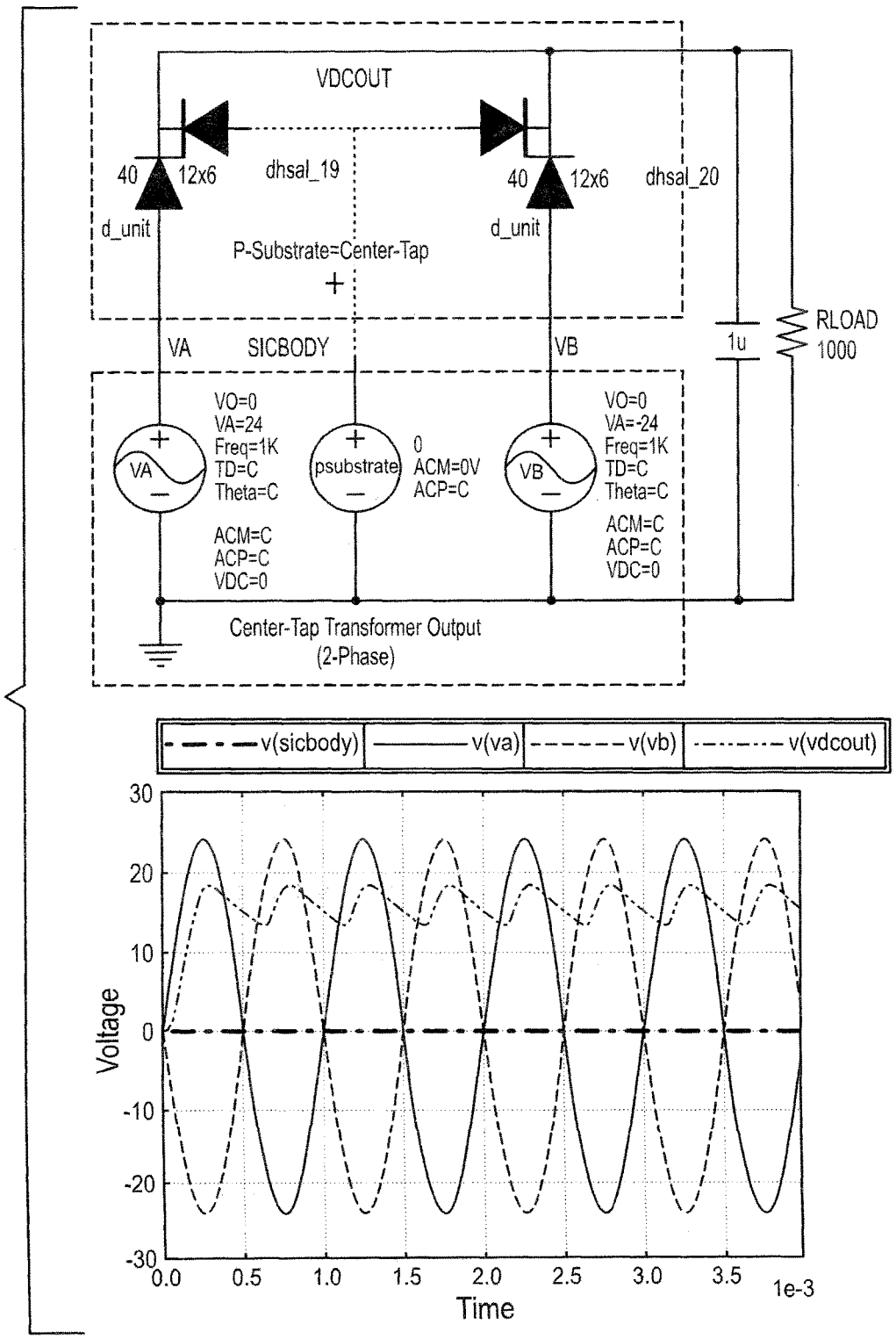
FIG. 1 shows a Two-Half-Wave Diode Rectifier for Center-Tap Transformer Schematic and associated waveforms.

As shown in FIG. 1 of the drawings, one exemplary embodiment of the present invention is generally shown using an isolation diode from the JFET N-channel to the P-Substrate which allows designing integrated diode rectification circuits. The P-Substrate connection must be made with respect to the chosen isolation transformer. It is not clear yet if integrated diode rectifier circuits provide a cost/reliability/performance trade-off with discrete SiC Schottky diodes on a ceramic substrate, however some integrated diode rectification topologies are considered next.

For a two-phase AC input from a center-tap transformer, two-half-wave rectifiers can be integrated on the same chip if the P-Substrate connection is tied to the transformer's center tap as shown in FIG. 1. The gate-to-channel diodes are shown vertically and the channel-to-substrate isolation diode is drawn horizontally. Note that the P-Substrate is tied to the center-tap of the 2-Phase transformer. Optionally in this circuit the P-Substrate may float with little effect on rectification function or performance.

Figure 2:
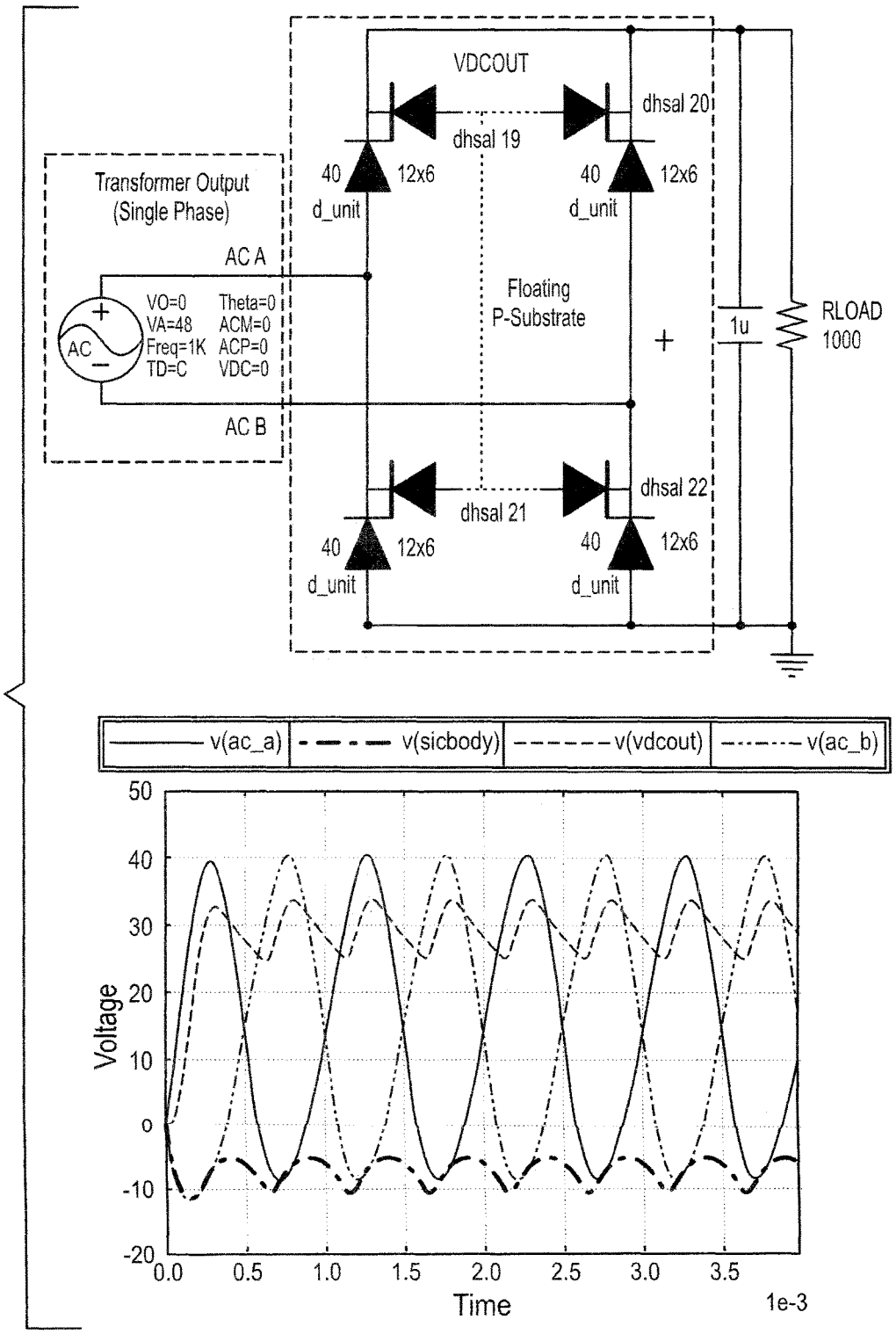
FIG. 2 shows an Integrated Full-wave Rectifier with Floating P-Substrate and associated waveforms.

In a similar fashion, a single-phase transformer output can be full-wave rectified, however in this case the P-Substrate must be allowed to float as shown in FIG. 2. Again, rectifying gate-to-channel diodes are drawn vertically and channel-to-substrate isolation diodes are drawn horizontally.

Due to the biasing of the P-Substrate it is not possible to rectify AC to a DC supply and use the DC supply to energize JFET logic on the same die.

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. An integrated diode rectification circuit, comprising for use with a two phase center tap transformer having a first voltage output, a second voltage output, and a center tap output:
    a single chip having a first half-wave rectifier connected to the first voltage output, a second half-wave rectifier connected to the second voltage output, and a P-Substrate connection connected to the center tap output; and
    an on chip first channel-to-substrate isolation diode electrically connected between the first half-wave rectifier and the P-substrate.

2. The circuit of claim 1, further comprising:
    an on chip second channel-to-substrate isolation diode electrically connected between the second half-wave rectifier and the P-substrate.

3. An integrated diode rectification circuit, for a single-phase transformer having a first voltage output and a second voltage output to supply a load with a first load connection and a second load connection, the circuit comprising:
    a single chip having a floating P-substrate, a first rectifying diode with a first anode and a first cathode, the first anode electrically connected to the first voltage output and the first cathode electrically connected to the first load connection, a first isolation diode with a first isolation anode and a first isolation cathode, the first isolation cathode electrically connected to the first load connection, a second rectifying diode with a second anode and a second cathode, the second anode electrically connected to the second load connection and the second cathode electrically connected to the second voltage output, a second isolation diode with a second isolation anode and a second isolation cathode, the second isolation cathode electrically connected to the second voltage output, and the first isolation anode electrically connected to the second isolation anode.

4. The circuit of claim 3, the single chip further comprising:
    a third rectifying diode with a third anode and a third cathode;
    the third anode electrically connected to the second load connection and the third cathode electrically connected to the first voltage output;
    a third isolation diode with a third isolation anode and a third isolation cathode;
    the third isolation cathode electrically connected to the first voltage output;
    the third isolation anode electrically connected to the first isolation anode and the second isolation anode;
    a fourth rectifying diode with a fourth anode and a fourth cathode;
    the fourth anode electrically connected to the second load connection and the fourth cathode electrically connected to the second voltage output;
    a fourth isolation diode with a fourth isolation anode and a fourth isolation cathode;
    the fourth isolation cathode electrically connected to the second voltage output;
    the fourth isolation anode electrically connected to the first isolation anode, the second isolation anode, and the third isolation anode.

* * * * *